US012602103B2

(12) United States Patent
Redaelli

(10) Patent No.: US 12,602,103 B2
(45) Date of Patent: Apr. 14, 2026

(54) ABRUPT SHUTDOWN AND ABRUPT POWER LOSS MANAGEMENT

(71) Applicant: Micron Technology, Inc., Boise, ID (US)

(72) Inventor: Marco Redaelli, Munich (DE)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/511,408

(22) Filed: Nov. 16, 2023

(65) Prior Publication Data

US 2024/0168539 A1      May 23, 2024

Related U.S. Application Data

(60) Provisional application No. 63/479,621, filed on Jan. 12, 2023, provisional application No. 63/384,155, filed on Nov. 17, 2022.

(51) Int. Cl.
| | |
|---|---|
| *G06F 1/32* | (2019.01) |
| *G06F 1/3212* | (2019.01) |
| *G06F 1/3234* | (2019.01) |
| *G11C 5/14* | (2006.01) |

(52) U.S. Cl.
CPC .......... *G06F 1/3275* (2013.01); *G06F 1/3212* (2013.01); *G11C 5/148* (2013.01)

(58) Field of Classification Search
CPC ...... G06F 1/3275; G06F 1/3212; G11C 5/148
See application file for complete search history.

(56) References Cited

U.S. PATENT DOCUMENTS

| | | | | |
|---|---|---|---|---|
| 2011/0128785 A1* | 6/2011 | Seo | ......................... | G11C 16/22 |
| | | | | 365/185.04 |
| 2014/0232333 A1* | 8/2014 | Kim | .......................... | G06F 1/30 |
| | | | | 320/108 |
| 2024/0004578 A1* | 1/2024 | Bae | ....................... | G06F 3/0656 |

* cited by examiner

*Primary Examiner* — Stefan Stoynov
(74) *Attorney, Agent, or Firm* — Harrity & Harrity, LLP

(57) ABSTRACT

Implementations described herein relate to abrupt shutdown and abrupt power loss management. In some implementations, a memory device may receive a reset signal and may perform an abrupt shutdown operation based on receiving the reset signal. For example, the memory device may perform a cache flush and a write protect operation. In some other implementations, the memory device may receive a reset signal and may perform an abrupt power loss operation based on receiving the reset signal. For example, the memory device may perform a write protect operation and a flash translation layer stand-by operation. The memory device may initiate a reduced power consumption state of the memory device based on a completion of the abrupt shutdown operation or the abrupt power loss operation.

20 Claims, 6 Drawing Sheets

600

610  Receive a reset signal

620  Perform an abrupt shutdown operation or an abrupt power loss operation based on receiving the reset signal 630  Initiate a hibernation state of the apparatus based on a completion of the abrupt shutdown operation or the abrupt power loss operation

ABRUPT SHUTDOWN AND ABRUPT POWER LOSS MANAGEMENT

CROSS-REFERENCE TO RELATED APPLICATION

This patent application claims priority to U.S. Provisional Patent Application No. 63/384,155, filed on Nov. 17, 2022, entitled "POWER HOLD-OFF CIRCUITRY FOR ABRUPT POWER LOSS MANAGEMENT," and U.S. Provisional Patent Application No. 63/479,621, filed on Jan. 12, 2023, and entitled "ABRUPT SHUTDOWN AND ABRUPT POWER LOSS MANAGEMENT," which are hereby expressly incorporated by reference herein.

TECHNICAL FIELD

The present disclosure generally relates to memory devices, memory device operations, and, for example, to abrupt shutdown and abrupt power loss management.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
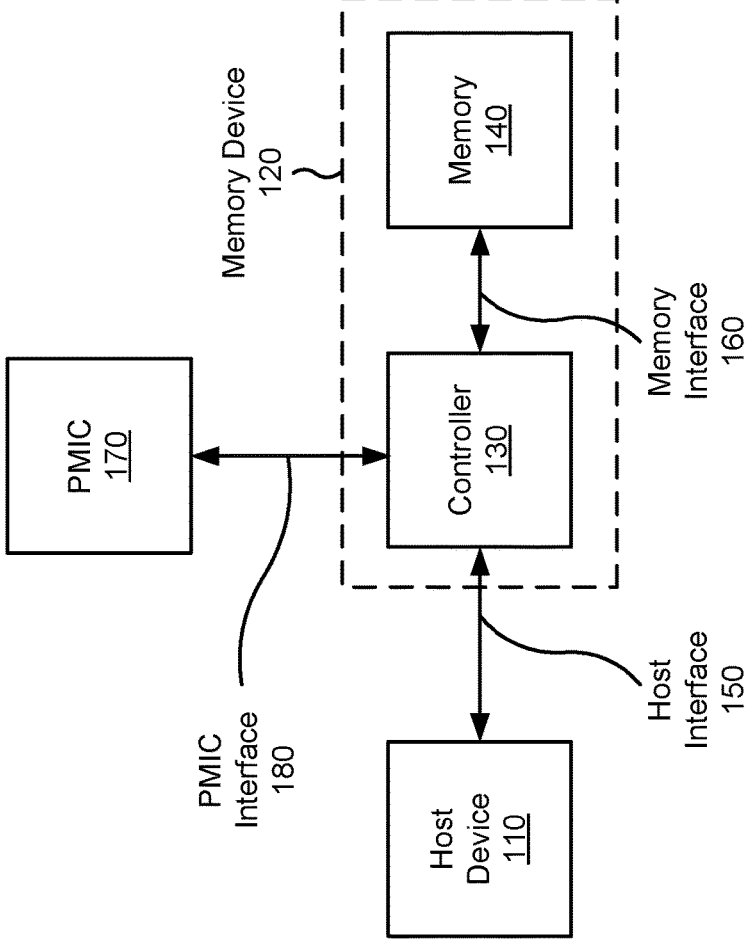
FIG. 1 is a diagram illustrating an example system capable of abrupt shutdown and abrupt power loss management.

A host device may initiate a shutdown of a memory device using non-volatile memory express (NVMe) commands. A complete shutdown of the memory device, which may be referred to as a power-off notification (PON) shutdown, may enable the memory device to complete ongoing memory operations prior to the memory device being shut down. In some other cases, the host device may initiate a forced quiescence (FQ) shutdown or an emergency power fail (EPF) shutdown of the memory device using peripheral component interconnect express (PCIe) commands. The PCIe commands may include, for example, power loss notification (PLN) signals or power loss acknowledgement (PLA) signals. An FQ shutdown or an EPF shutdown of the memory device may enable the memory device to perform some data or metadata storing operations prior to the memory device being shut down in order to avoid memory device corruption.

A memory device such as a solid-state drive (SSD) may require power management circuitry that includes features such as voltage hold-off circuitry and power loss detection to be used for data protection during an abrupt power loss (APL) event. This may be used to prevent any flash translation layer (FTL) damage that may result in performance of a write protect operation. In data center applications, the main system power may be backed-up through a secure and uninterruptable power supply (UPS). Consequently, a power hold time of two seconds to ten seconds (2 s to 10 s) in the case of an APL event may be reasonable.

In some cases, for embedded systems such as automotive, industrial, and Internet of Things (IOT) applications, host system-on-chip (SOC) power may not be able to be sustained during an APL since the host SOC power may drain significant power from power hold-off circuit. An embedded system may not have a UPS due to form factor limits and/or to limit system cost. In some cases, such as in the example of a low battery condition, the host device may use the NVMe commands and/or the PCIe commands (such as PLN and PLA) to manage the memory device shutdown. In some other cases, such as in the example of a physical battery disconnection, the host device may not be able to power the memory device for a duration of a PON shutdown or a PLN/PLA based shutdown. This may result in memory device (e.g., NAND) corruption since the memory device may not be able to perform any write protect operation prior to the APL.

In some implementations, a system may include a battery, a power management integrated circuit (PMIC), and a memory device, among other examples. The PMIC may use hardware signals for initiating a shutdown of the memory device in the event of an APL (such as a physical battery disconnection). In one example, the PMIC may detect that a voltage associated with the battery has dropped below a voltage threshold, and may assert a reset signal based on the voltage associated with the battery dropping below the voltage threshold. The memory device may detect the reset signal, and may perform an abrupt shutdown operation based on detecting the reset signal. The memory device may perform the abrupt shutdown operation by performing a cache flush and by performing a write protect operation based on a completion of the cache flush. Additionally, the memory device may initiate a reduced power consumption state of the memory device (e.g., a hibernation state) based on a completion of the abrupt shutdown operation. In another example, the memory device may detect the reset signal, and may perform an abrupt power loss operation based on detecting the reset signal. The memory device may perform the abrupt power loss operation by performing a write protect operation after a last memory device command has been acknowledged, and by performing a flash translation layer stand-by until a peripheral component interconnect express link is re-connected and command processing has resumed. Additionally, the memory device may initiate a reduced power consumption state of the memory device (e.g., a hibernation state) based on a completion of the abrupt power loss operation. The memory device may perform either the abrupt shutdown operation or the abrupt power loss operation in accordance with a configuration of the memory device. The abrupt shutdown operation and the abrupt power loss operation may be accomplished using hardware signals and without any intervention by the host device, and may reduce a likelihood of memory device (e.g., NAND) corruption. Additional details are described herein.

FIG. 1 is a diagram illustrating an example system 100 capable of abrupt shutdown and abrupt power loss management. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IOT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the system 100 may include a PMIC 170. The PMIC 170 may be configured to provide power control to one or more devices such as the memory device 120 or the host device 110. The PMIC 170 may include a voltage detection circuit, a filter, a pre-regulator, and/or a power hold-off circuit, among other examples. A PMIC interface 180 may be used to enable communication between the memory device 120 and the PMIC 170.

In some implementations, the memory device 120 may be configured to receive a reset signal; perform an abrupt shutdown operation based on receiving the reset signal, wherein the one or more components, to perform the abrupt shutdown operation, are configured to: perform a cache flush; and perform a write protect operation based on a completion of the cache flush; and initiate a reduced power consumption state of the memory device based on a completion of the abrupt shutdown operation.

In some implementations, the memory device 120 may be configured to receive a reset signal; perform an abrupt power loss operation based on receiving the reset signal, wherein the one or more components, to perform the abrupt power loss operation, are configured to: perform a write protect operation after a last memory device command has been acknowledged; and perform flash translation layer stand-by until a peripheral component interconnect express link is re-connected and command processing has resumed; and initiate a reduced power consumption state of the memory device based on a completion of the abrupt power loss operation.

In some implementations, the memory device 120 may be configured to receive a reset signal; perform an abrupt shutdown operation or an abrupt power loss operation based on receiving the reset signal; and initiate a reduced power consumption state of the memory device based on a completion of the abrupt shutdown operation or the abrupt power loss operation.

As indicated above, FIG. 1 is provided as an example. Other examples may differ from what is described with regard to FIG. 1.

Figure 2:
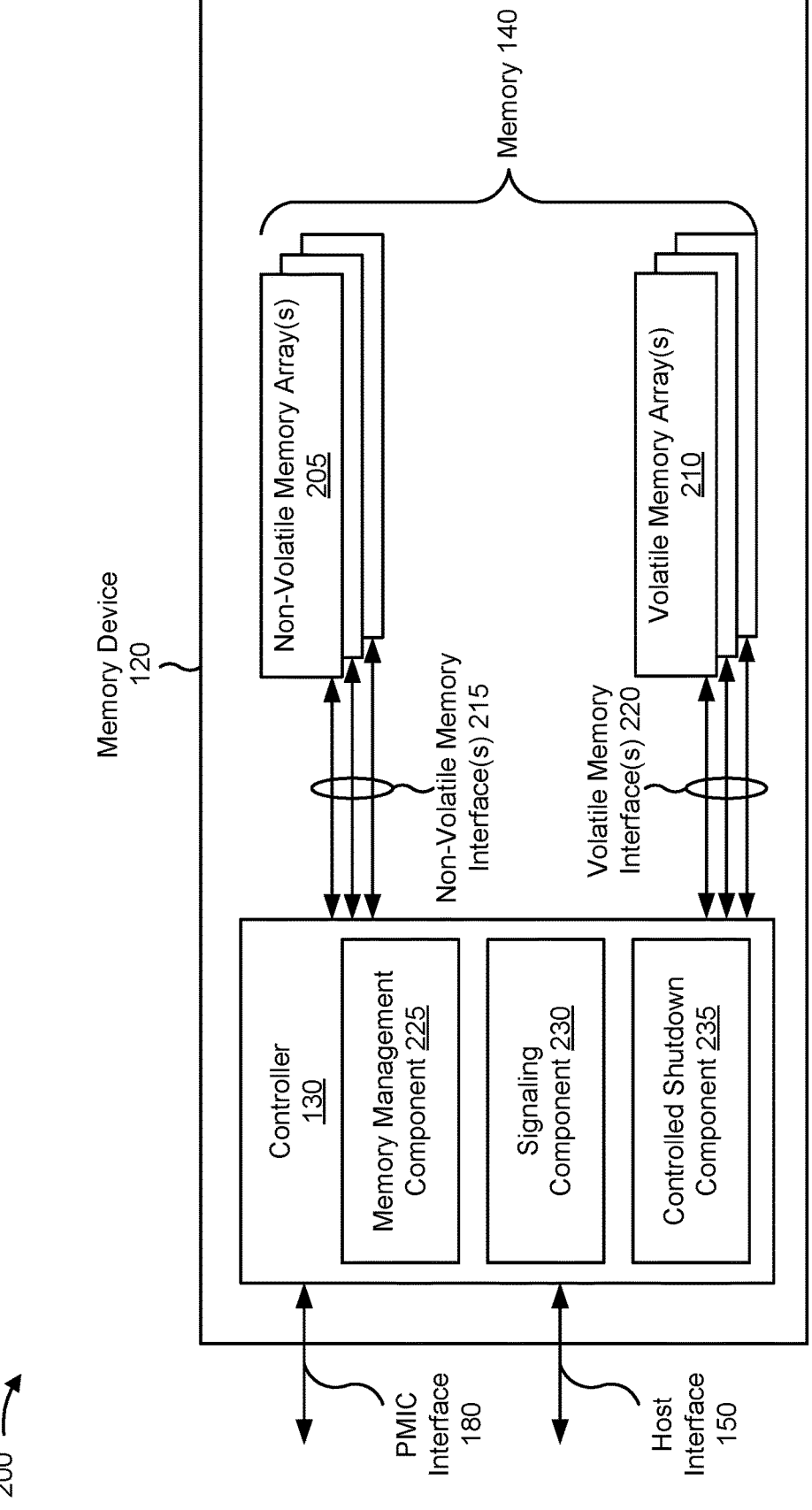
FIG. 2 is a diagram of example components included in a memory device.

FIG. 2 is a diagram of example components 200 included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. Additionally, or alternatively, the controller 130 may receive one or more signals from the PMIC 170 via the PMIC interface 180, and may perform one or more actions based on the one or more signals. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, a signaling component 230, and/or a controlled shutdown component 235. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The signaling component 230 may be configured to receive one or more signals from the PMIC 170 and/or the host device 110. In some implementations, the signaling component 230 and/or the memory device 120 may receive a reset signal from the PMIC 170. The memory device 120 may perform one or more actions based on receiving the reset signal from the PMIC 170. In one example, the memory device 120 may perform an abrupt shutdown operation based on receiving the reset signal. In another example, the memory device 120 may perform an abrupt power loss operation based on receiving the reset signal.

The controlled shutdown component 235 may be configured to perform a controlled shutdown of the memory device 120. The controlled shutdown component 235 may perform the controlled shutdown of the memory device 120 based on receiving the reset signal from the PMIC 170. The controlled shutdown component 235 may perform one of the abrupt shutdown operation or the abrupt power loss operation in accordance with a configuration of the memory device 120. For example, if the memory device 120 is configured to perform the abrupt shutdown operation, the controlled shutdown component 235 may perform a cache flush, perform a write protect operation based on a completion of the cache flush, and initiate a reduced power consumption state of the memory device. In another example, if the memory device 120 is configured to perform the abrupt power loss operation, the controlled shutdown component 235 may perform a write protect operation after a last memory device command has been acknowledged, perform flash translation layer stand-by until a peripheral component interconnect express link is re-connected and command processing has resumed, and initiate a reduced power consumption state of the memory device. Additional details are described herein.

One or more devices or components shown in FIG. 2 may be configured to perform operations described herein, such as one or more operations and/or methods described in connection with FIG. 3. For example, the controller 130, the memory management component 225, the signaling component 230, and/or the controlled shutdown component 235 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
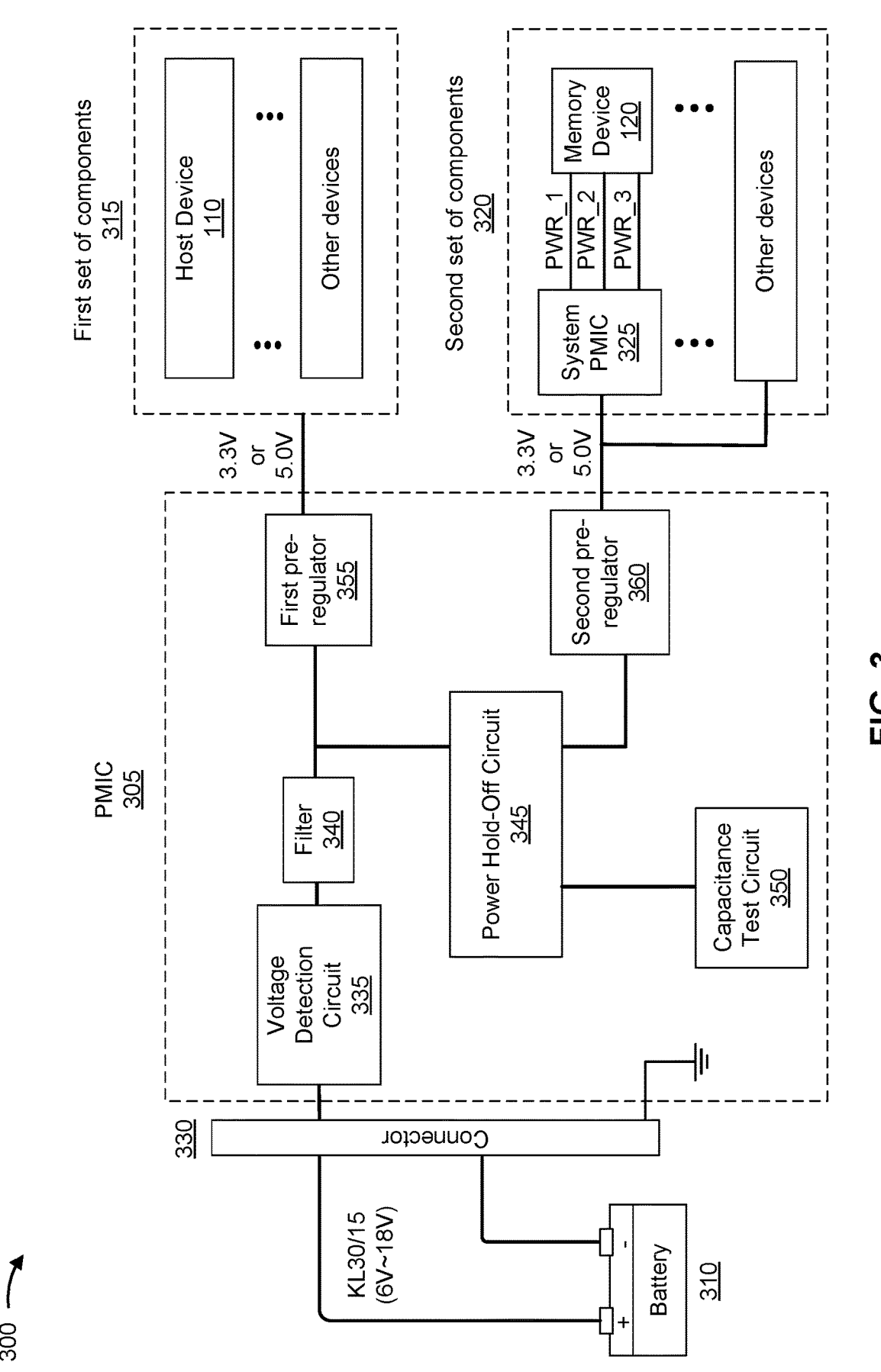
FIG. 3 is a diagram illustrating an example system for abrupt shutdown and abrupt power loss management.

FIG. 3 is a diagram illustrating an example system 300 for abrupt shutdown and abrupt power loss management. The system 300 may include a PMIC 305, a battery 310, a first set of components 315, and a second set of components 320. The PMIC 305 may be configured to control power to the battery 310, such as during the occurrence of an APL. The first set of components may include one or more devices that do not require a power backup. The first set of components 315 may include a host device, such as the host device 110. The second set of components may include one or more devices that require a power backup. The second set of components 320 may include a memory device, such as the memory device 120. In some implementations, the second set of components 320 may include a system PMIC 325 that is associated with the memory device 120. The battery 310 may be configured to provide power to the first set of components 315 and the second set of components 320 when the battery 310 is in a connected state. In some implementations, the system 300 may include a connector 330. The connector 330 may be configured to connect the battery 310 to the PMIC 305.

In some implementations, the PMIC 305 may include one or more of a voltage detection circuit 335, a filter 340, a power hold-off circuit 345, a capacitance test circuit 350, a first pre-regulator 355, and a second pre-regulator 360. The voltage detection circuit 335 may be, for example, a reverse under-voltage over-voltage protection circuit. The voltage detection circuit 335 may be configured to detect whether the voltage from the battery 310 satisfies the voltage threshold. For example, the voltage detection circuit 335 may detect that the voltage from the battery 310 satisfies the voltage threshold based on the voltage from the battery being greater than, or greater than or equal to, the voltage threshold, or may detect that the voltage from the battery 310 does not satisfy the voltage threshold based on voltage from the battery 310 being less than, or less than or equal to, the voltage threshold. The filter 340 may be, for example, a low-pass filter, a high-pass filter, a band-pass filter, or a notch filter, among other examples. The power hold-off circuit 345 may be configured to provide power to some components in the event of an APL. For example, the power hold-off circuit 345 may be configured to provide power to the second set of components 320 but not the first set of components 315 during the APL. In some implementations, the power hold-off circuit 345 may include one or more of a switch, a step-up regulator, a step-down regulator, and a power hold-off capacitor, among other examples. The capacitance test circuit 350 may be configured to test one or more capacitors. For example, the capacitance test circuit 350 may be configured to identify a capacitance of the one or more capacitors based on measuring a voltage and/or a current associated with the one or more capacitors. The first pre-regulator 355 may be located in a path that is between the battery 310 and the first set of components 315, and may be configured to regulate a voltage to the first set of components 315. The second pre-regulator 360 may be located in a path that is between the battery 310 and the second set of components 320, and may be configured to regulate a voltage to the second set of components 320.

In some implementations, a PCIe link between the memory device 120 and the host device 110 may become disconnected. The PCIe link may be a link (e.g., a bus) between the memory device 120 and the host device 110 that is used to share information between the memory device 120 and the host device 110. When the PCIe link between the memory device 120 and the host device 110 becomes disconnected, such as during an unplug, the memory device 120 may initiate a write protect operation. The memory device 120 may initiate the write protect operation after a last memory device command (e.g., NAND command) is acknowledged. Additionally, the memory device 120 may initiate a flash translation layer stand-by until the PCIe link is re-connected and command processing is resumed.

In some implementations, a reference clock (e.g., REFCLK) may stop during a data transfer between the memory device 120 and the host device 110. The reference clock may be used by the memory device 120 and the host device 110 to assist with timing for data exchange. When the reference clock stops during a data transfer between the memory device 120 and the host device 110, the memory device may initiate a write protect operation. The memory device 120 may initiate the write protect operation after a last memory device command (e.g., NAND command) is acknowledged. Additionally, the memory device 120 may initiate a flash translation layer stand-by until the reference clock is stable and outstanding command processing is resumed. This may prevent major NAND corruption due to aborted program or erase operations. The write protect operation associated with the reference clock may occur separate from the write protect operation associated with the PCIe link and/or may occur before, after, or simultaneously with the write protect operation associated with the PCIe link.

In some implementations, the PMIC 305 may determine to initiate a shutdown of the memory device 120. For example, the PMIC 305 may determine to initiate the shutdown of the memory device 120 based on a voltage associated with the battery 310 dropping below a voltage threshold, such as below 6V, 12V, or 18V. In this case, the PMIC 305 may assert a reset signal. The reset signal (RST_n) may be an active low signal. Thus, the reset signal may be asserted based on the state of the reset signal changing (e.g., transitioning) from a high state (e.g., "1") to a low state (e.g., "0"). The memory device 120 may be configured to perform an abrupt shutdown operation or an abrupt power loss operation based on a configuration of the memory device 120. For example, the memory device 120 may be configured to perform only one of the abrupt shutdown operation or the abrupt power loss operation. The memory device 120 may perform the abrupt shutdown operation based on receiving the reset signal and based on the memory device 120 being configured to perform the abrupt shutdown operation. Alternatively, the memory device 120 may perform the abrupt power loss operation based on receiving the reset signal and based on the memory device 120 being configured to perform the abrupt power loss operation. In some implementations, the memory device 120 may be configured to perform both the abrupt shutdown operation and the abrupt power loss operation, and may determine whether to perform the abrupt shutdown operation or the abrupt power loss operation based on information, such as information received from the PMIC 305.

In some implementations, the memory device 120 may initiate the abrupt shutdown operation based on receiving the reset signal from the PMIC 305. In this case, the memory device 120 may abort any outstanding memory device commands, and may perform a cache flush. The cache flush may be, for example, an eMMC or UFS embedded cache flush. Additionally, the memory device 120 may initiate a write protect operation based on a completion of the cache flush. In some implementations, a microcontroller associated with the memory device 120 may initiate a reduced power consumption state of the memory device 120, such as a hibernation state of the memory device 120, based on a completion of the cache flush and/or the write protect operation.

In some implementations, the memory device may initiate the abrupt power loss operation based on receiving the reset signal from the PMIC 305. In this case, the memory device 120 may initiate a write protect operation after a last memory device command (e.g., NAND command) is acknowledged. Additionally, the memory device 120 may initiate a flash translation layer stand-by until the PCIe link is re-connected and command processing is resumed. In some implementations, a microcontroller associated with the memory device 120 may initiate a reduced power consumption state of the memory device 120, such as a hibernation state of the memory device 120, based on a completion of the write protect operation.

In some implementations, the PMIC 305 may not be required to acknowledge a completion of the abrupt shutdown operation or the abrupt power loss operation. Thus, the memory device 120 may not send any completion indication to the PMIC 305 after completing the abrupt shutdown operation or the abrupt power loss operation.

As described herein, the abrupt shutdown operation or the abrupt power loss operation may be performed by the memory device 120 to avoid memory device (e.g., NAND) corruption. This may be accomplished using hardware signals and without any intervention by the host device 110. However, the memory device 120 may not save any data or metadata (or may only save a portion of the data or metadata) during the abrupt shutdown operation or the abrupt power loss operation. A next start-up (e.g., initialization) of the memory device 120 may take longer than a standard start-up of the memory device 120 since the memory device 120 may need to perform some data storing or organization operations prior to being used.

As indicated above, FIG. 3 is provided as an example. Other examples may differ from what is described with regard to FIG. 3.

Figure 4:
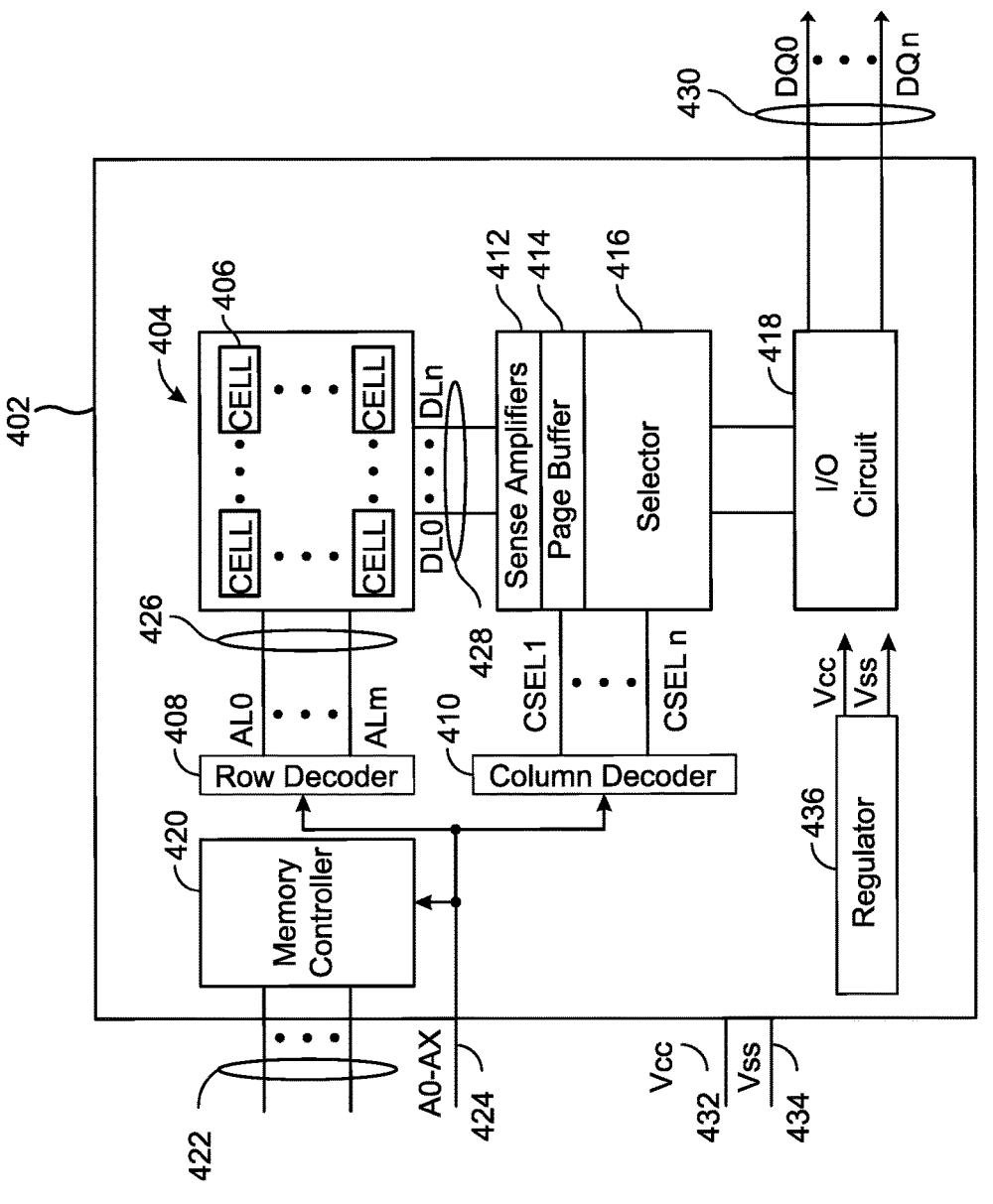
FIG. 4 is a diagram illustrating an example of components included in a memory device.

FIG. 4 is a diagram illustrating an example of components 400 included in a memory device 402. The memory device 402 may be the memory device 120. The memory device 402 may include a memory array 404 having multiple memory cells 406. The memory device 402 may include one or more components (e.g., circuits) to transmit signals to or perform memory operations on the memory array 404. For example, the memory device 402 may include a row decoder 408, a column decoder 410, one or more sense amplifiers 412, a page buffer 414, a selector 416, an input/output (I/O) circuit 418, and a memory controller 420. The memory controller 420 may be the controller 130.

The memory controller 420 may control memory operations of the memory device 402 according to one or more signals received via one or more control lines 422, such as one or more clock signals or control signals that indicate an operation (e.g., write, read, or erase) to be performed. Additionally, or alternatively, the memory controller 420 may determine one or memory cells 406 upon which the operation is to be performed based on one or more signals received via one or more address lines 424, such as one or more address signals (shown as A0-AX). A host device external from the memory device 402 may control the values of the control signals on the control lines 422 and/or the address signals on the address line 424.

The memory device 402 may use access lines 426 (sometimes called word lines or row lines, and shown as AL0-ALm) and data lines 428 (sometimes called digit lines, bit lines, or column lines, and shown as DL0-DLn) to transfer data to or from one or more of the memory cells 406. For example, the row decoder 408 and the column decoder 410 may receive and decode the address signals (A0-AX) from the address line 424 and may determine which of the memory cells 406 are to be accessed based on the address signals. The row decoder 408 and the column decoder 410 may provide signals to those memory cells 406 via one or more access lines 426 and one or more data lines 428, respectively.

For example, the column decoder 410 may receive and decode address signals into one or more column select signals (shown as CSEL1-CSELn). The selector 416 may receive the column select signals and may select data in the page buffer 414 that represents values of data to be read from or to be programmed into memory cells 406. The page buffer 414 may be configured to store data received from a host device before the data is programmed into relevant portions of the memory array 404, or the page buffer 414 may store data read from the memory array 404 before the data is transmitted to the host device. The sense amplifiers 412 may be configured to determine the values to be read from or written to the memory cells 406 using the data lines 428. For example, in a selected string of memory cells 406, a sense amplifier 412 may read a logic level in a memory cell 406 in response to a read current flowing through the selected string to a data line 428. The I/O circuit 418 may transfer values of data into or out of the memory device 402 (e.g., to or from a host device), such as into or out of the page buffer 414 or the memory array 404, using I/O lines 430 (shown as (DQ0-DQn)).

The memory controller 420 may receive positive and negative supply signals, such as a supply voltage (Vcc) 432 and a negative supply (Vss) 434 (e.g., a ground potential), from an external source or power supply (e.g., an internal battery, an external battery, and/or an AC-to-DC converter). In some implementations, the memory controller 420 may include a regulator 436 to internally provide positive or negative supply signals.

Figure 6:
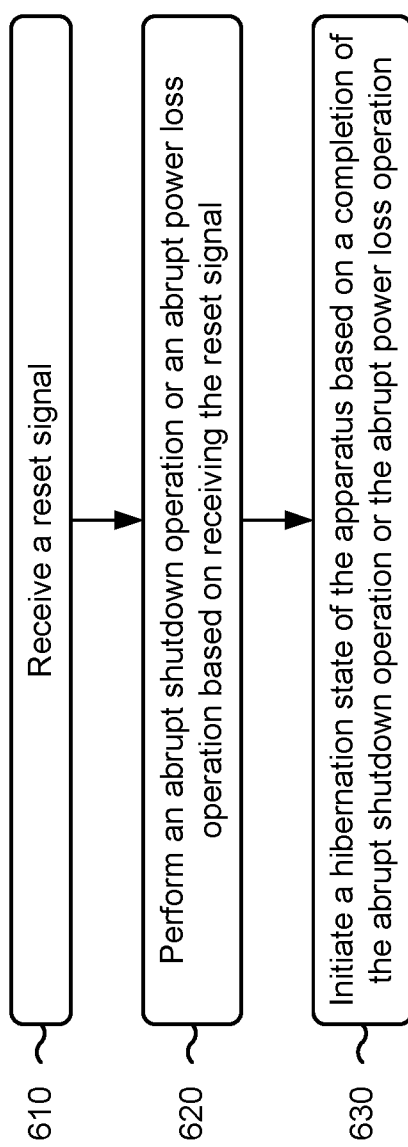
FIG. 6 is a flowchart of an example method associated with abrupt shutdown and abrupt power loss management.

One or more devices or components shown in FIG. 4 may be used to carry out operations described elsewhere herein, such as one or more operations of FIG. 3 and/or one or more process blocks of the methods of FIG. 6.

As indicated above, FIG. 4 is provided as an example. Other examples may differ from what is described with regard to FIG. 4.

Figure 5:
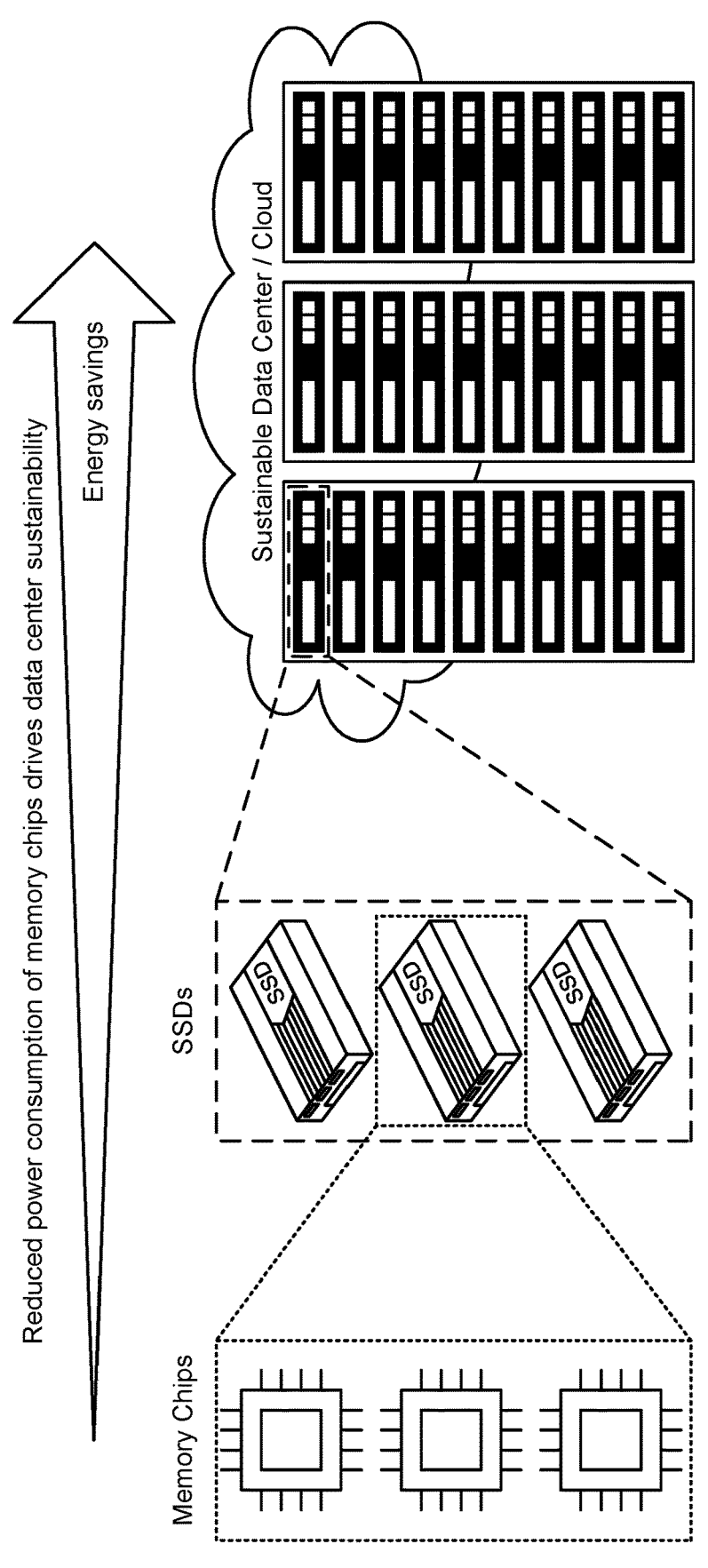
FIG. 5 is a diagram illustrating example systems in which the memory device described herein may be used.

FIG. 5 is a diagram illustrating example systems 500 in which the memory device 120 described herein may be used. In some implementations, one or more memory devices 120 may be included in a memory chip. Multiple memory chips may be packaged together and included in a higher level system, such as a solid state drive (SSD) or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 5, this reduced power consumption drives data center sustainability and leads to energy savings because of the large volume of memory devices 120 included in a data center.

As indicated above, FIG. 5 is provided as an example. Other examples may differ from what is described with regard to FIG. 5.

FIG. 6 is a flowchart of an example method 600 associated with abrupt shutdown and abrupt power loss management. In some implementations, a memory device (e.g., the memory device 120) may perform or may be configured to perform the method 600. In some implementations, another device or a group of devices separate from or including the memory device (e.g., the system 100) may perform or may be configured to perform the method 600. Additionally, or alternatively, one or more components of the memory device (e.g., the controller 130, the memory management component 225, the signaling component 230, and/or the controlled shutdown component 235) may perform or may be configured to perform the method 600. Thus, means for performing the method 600 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 600.

As shown in FIG. 6, the method 600 may include receiving a reset signal (block 610). As further shown in FIG. 6, the method 600 may include performing an abrupt shutdown operation or an abrupt power loss operation based on receiving the reset signal (block 620). As further shown in FIG. 6, the method 600 may include initiating a reduced power consumption state of the apparatus based on a completion of the abrupt shutdown operation or the abrupt power loss operation (block 630).

The method 600 may include additional aspects, such as any single aspect or any combination of aspects described below and/or described in connection with one or more other methods or operations described elsewhere herein.

In a first aspect, the method 600 includes determining whether a configuration of the apparatus indicates to perform the abrupt shutdown operation or the abrupt power loss operation.

In a second aspect, alone or in combination with the first aspect, the means for performing the abrupt shutdown operation comprises performing a cache flush, and performing a write protect operation based on a completion of the cache flush.

In a third aspect, alone or in combination with one or more of the first and second aspects, the means for performing the abrupt power loss operation comprises performing a write protect operation after a last memory device command has been acknowledged, and performing a flash translation layer stand-by until a peripheral component interconnect express link is re-connected and command processing has resumed.

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein.

In some implementations, a memory device includes one or more components configured to: receive a reset signal; perform an abrupt shutdown operation based on receiving the reset signal, wherein the one or more components, to perform the abrupt shutdown operation, are configured to: perform a cache flush; and perform a write protect operation based on a completion of the cache flush; and initiate a reduced power consumption state of the memory device based on a completion of the abrupt shutdown operation.

In some implementations, a memory device includes one or more components configured to: receive a reset signal; perform an abrupt power loss operation based on receiving the reset signal, wherein the one or more components, to perform the abrupt power loss operation, are configured to: perform a write protect operation after a last memory device command has been acknowledged; and perform flash translation layer stand-by until a peripheral component interconnect express link is re-connected and command processing has resumed; and initiate a reduced power consumption state of the memory device based on a completion of the abrupt power loss operation.

In some implementations, an apparatus includes means for receiving a reset signal; means for performing an abrupt shutdown operation or an abrupt power loss operation based on receiving the reset signal; and means for initiating a reduced power consumption state of the apparatus based on a completion of the abrupt shutdown operation or the abrupt power loss operation.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one." "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
  receive a reset signal;
  perform an abrupt shutdown operation based on receiving the reset signal, wherein the one or more components, to perform the abrupt shutdown operation, are configured to:
    perform a cache flush; and
    perform a write protect operation based on a completion of the cache flush;
  initiate a reduced power consumption state of the memory device based on a completion of the abrupt shutdown operation;
  detect that a peripheral component interconnect express link between the memory device and a host device has been disconnected;
  perform another write protect operation; and
  initiate a flash translation layer stand-by until the peripheral component interconnect express link is re-connected and command processing has resumed.

2. The memory device of claim 1,
wherein the one or more components are configured to abort all outstanding memory device commands prior to performing the abrupt shutdown operation.

3. The memory device of claim 1,
wherein the abrupt shutdown operation is associated with a low battery condition of the memory device.

4. The memory device of claim 1,
wherein the one or more components are configured to:
  detect that a reference clock has stopped during a data transfer;
  perform another write protect operation; and
  initiate a flash translation layer stand-by until the reference clock is in a stable condition and command processing has resumed.

5. The memory device of claim 1,
wherein the one or more components, to receive the reset signal, are configured to identify that the reset signal has transitioned from a high state to a low state.

6. The memory device of claim 1,
wherein the one or more components, to receive the reset signal, are configured to receive the reset signal from a power management integrated circuit based on the memory device experiencing a low voltage condition.

7. The memory device of claim 1,
wherein the memory device is an embedded multi-media card memory device or a universal flash storage memory device.

8. An apparatus, comprising:
means for receiving a reset signal;
means for performing an abrupt shutdown operation or an abrupt power loss operation based on receiving the reset signal, wherein the means for performing the abrupt power loss operation comprise:
  means for performing a write protect operation after a last memory device command has been acknowledged; and
  means for performing a flash translation layer stand-by until a peripheral component interconnect express link is re-connected and command processing has resumed; and
means for initiating a reduced power consumption state of the apparatus based on a completion of the abrupt shutdown operation or the abrupt power loss operation.

9. The apparatus of claim 8, further comprising
means for determining whether a configuration of the apparatus indicates to perform the abrupt shutdown operation or the abrupt power loss operation.

10. The apparatus of claim 8,
wherein the means for performing the abrupt shutdown operation comprises:
  means for performing a cache flush; and
  means for performing a write protect operation based on a completion of the cache flush.

11. The apparatus of claim 8, wherein the means for receiving the reset signal comprise:
means for identifying that the reset signal has transitioned from a high state to a low state.

12. The apparatus of claim 8, wherein the means for receiving the reset signal comprise:
means for receiving the reset signal from a power management integrated circuit based on the apparatus experiencing a low voltage condition.

13. The apparatus of claim 8, further comprising:
means for aborting all outstanding apparatus commands prior to performing the abrupt shutdown operation.

14. A method, comprising:
receiving, by a memory device, a reset signal;
performing, by the memory device, an abrupt shutdown operation based on receiving the reset signal, wherein performing the abrupt shutdown operation comprises:
  performing a cache flush; and
  performing a write protect operation based on a completion of the cache flush;
initiating, by the memory device, a reduced power consumption state of the memory device based on a completion of the abrupt shutdown operation;
detecting that a peripheral component interconnect express link between the memory device and a host device has been disconnected;
performing another write protect operation; and
initiating a flash translation layer stand-by until the peripheral component interconnect express link is re-connected and command processing has resumed.

15. The method of claim 14, further comprising:
aborting all outstanding memory device commands prior to performing the abrupt shutdown operation.

16. The method of claim 14,
wherein the abrupt shutdown operation is associated with a low battery condition of the memory device.

17. The method of claim 14, further comprising:

detecting that a reference clock has stopped during a data transfer;

performing another write protect operation; and initiating a flash translation layer stand-by until the reference clock is in a stable condition and command processing has resumed.

18. The method of claim 14, wherein receiving the reset signal comprises:

identifying that the reset signal has transitioned from a high state to a low state.

19. The method of claim 14, wherein receiving the reset signal comprises:

receiving the reset signal from a power management integrated circuit based on the memory device experiencing a low voltage condition.

20. The method of claim 14, wherein the memory device is an embedded multi-media card memory device or a universal flash storage memory device.

* * * * *